(12) United States Patent
Yeh et al.

(10) Patent No.: US 11,790,822 B1
(45) Date of Patent: Oct. 17, 2023

(54) DISPLAY APPARATUS

(71) Applicant: AUO Corporation, Hsinchu (TW)

(72) Inventors: Yen-Wei Yeh, Hsinchu (TW); Wei-Li Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/088,778

(22) Filed: Dec. 27, 2022

(30) Foreign Application Priority Data

Oct. 28, 2022 (TW) .................................. 111141215

(51) Int. Cl.
*G09G 3/20* (2006.01)
*H05K 1/14* (2006.01)

(52) U.S. Cl.
CPC ....... *G09G 3/20* (2013.01); *G09G 2310/0267* (2013.01); *G09G 2310/08* (2013.01); *G09G 2320/0242* (2013.01); *H05K 1/147* (2013.01); *H05K 2201/10128* (2013.01)

(58) Field of Classification Search
CPC ............. G09G 3/20; G09G 2310/0267; G09G 2310/08; G09G 2320/0242; H05K 1/147; H05K 2201/10128
See application file for complete search history.

(56) References Cited

U.S. PATENT DOCUMENTS

| | | | | |
|---|---|---|---|---|
| 2021/0063754 A1* | 3/2021 | Lee | .......................... | G06F 3/147 |
| 2021/0065601 A1* | 3/2021 | Zheng | ..................... | G11C 19/28 |
| 2021/0065603 A1* | 3/2021 | Feng | ....................... | G11C 19/28 |
| 2021/0065641 A1* | 3/2021 | He | ......................... | G09G 3/3655 |
| 2021/0065645 A1* | 3/2021 | He | ......................... | G02F 1/1368 |
| 2021/0065659 A1* | 3/2021 | Takahashi | ............. | H04N 9/3185 |

FOREIGN PATENT DOCUMENTS

| TW | M588344 | 12/2019 |
|---|---|---|
| TW | I777858 | 9/2022 |

\* cited by examiner

*Primary Examiner* — Sejoon Ahn
(74) *Attorney, Agent, or Firm* — JCIPRNET

(57) ABSTRACT

A display apparatus is provided. The display apparatus includes a display panel and a plurality of flexible printed circuit boards. The display panel has a fan-out area and a display area. The flexible printed circuit boards are coupled to the display panel. A first side of each flexible printed circuit board is configured with a plurality of first traces for transmitting a first group of clock signals among a plurality of clock signals, and a second side of each flexible printed circuit board opposite to the first side is configured with a plurality of second traces for transmitting a second group of clock signals among the clock signals. The first group of clock signals of one of the flexible printed circuit boards and the second group of clock signals of the adjacent flexible printed circuit board are transmitted to the display area through the fan-out area together.

8 Claims, 1 Drawing Sheet

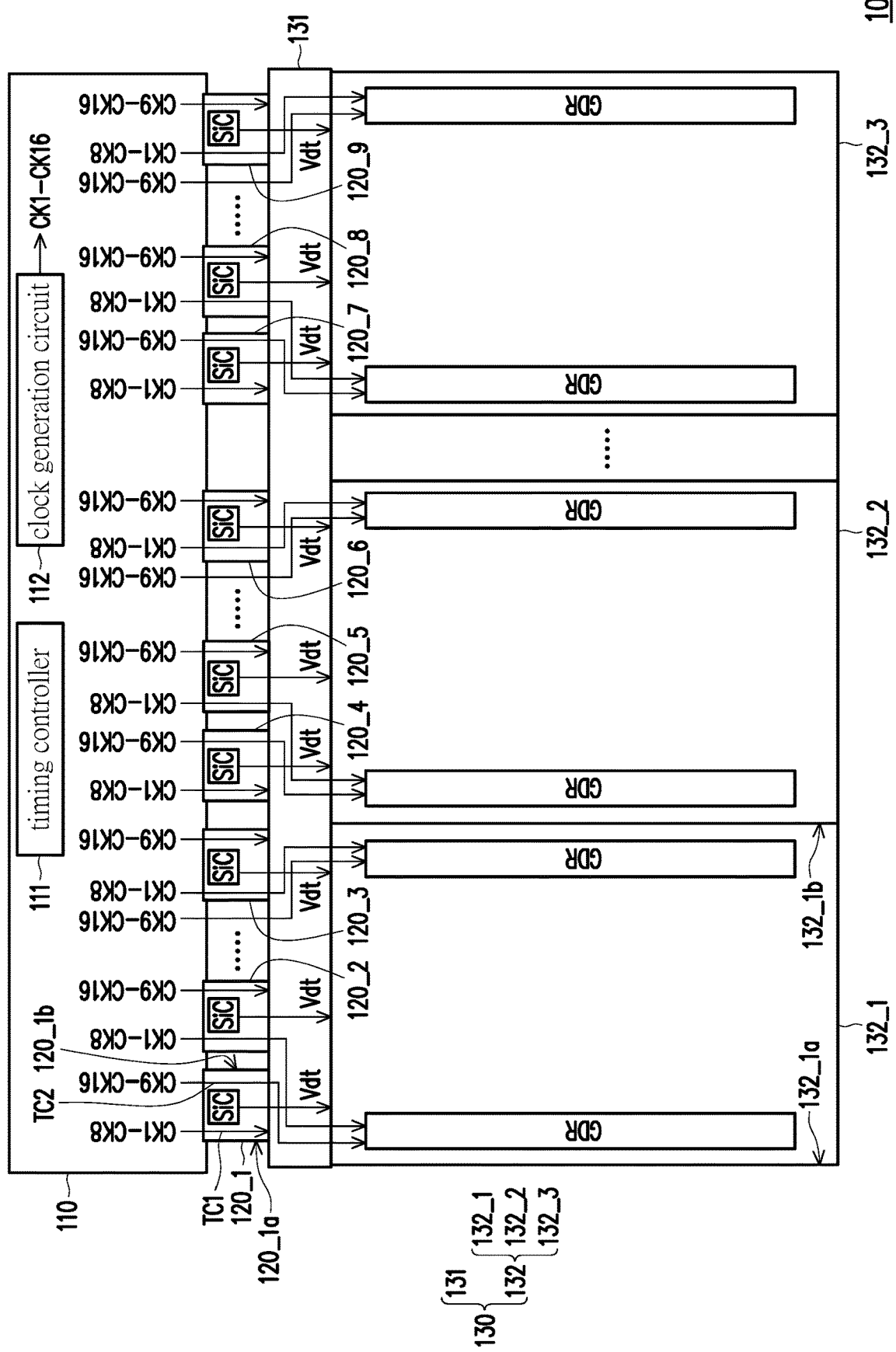

DISPLAY APPARATUS

CROSS-REFERENCE TO RELATED APPLICATION

This application claims the priority benefit of Taiwan application serial no. 111141215, filed on Oct. 28, 2022. The entirety of the above-mentioned patent application is hereby incorporated by reference herein and made a part of this specification.

BACKGROUND

Technical Field

The disclosure relates to a display apparatus, and particularly relates to a display apparatus which has a plurality of display areas.

Description of Related Art

In a display apparatus, in addition to a display panel configured with pixels, there is also a timing controller configured on a rigid printed circuit board. The display panel and the rigid printed circuit board are electrically connected to each other through a plurality of flexible printed circuit boards, and a driving circuit may be configured on the flexible printed circuit board to improve an overall utilization rate. Further, a control signal (e.g., clock signal) provided by the circuit on the rigid printed circuit board is not only provided to the circuit on the flexible printed circuit board, but also transmitted to the display panel through the flexible printed circuit board. However, due to the existence of the circuit on the flexible printed circuit board, the flexible printed circuit board transmits the control signal from the rigid printed circuit board through two sides, which affects the line impedance of the control signal, and also affects the display effect of the display panel.

SUMMARY

The disclosure provides a display apparatus which can match a line impedance between clock signals, so as to suppress a chromatic aberration formed on a display panel due to a mismatch of the line impedance of the clock signals.

The display apparatus according to an embodiment of the disclosure includes a display panel and a plurality of flexible printed circuit boards. The display panel has a fan-out area and a display area. The flexible printed circuit boards are coupled to the display panel, a first side of each flexible printed circuit board is configured with a plurality of first traces for transmitting a first group of clock signals among a plurality of clock signals, and a second side of each flexible printed circuit board opposite to the first side is configured with a plurality of second traces for transmitting a second group of clock signals among the clock signals. The first group of clock signals of one of the flexible printed circuit boards and the second group of clock signals of an adjacent flexible printed circuit board are transmitted to the display area through the fan-out area together.

Based on the above, in the display apparatus of the embodiment of the disclosure, the first group of clock signals of one of the flexible printed circuit boards and the second group of clock signals of the adjacent flexible printed circuit board are transmitted to the display area through the fan-out area together, which can be matched to the line impedance between the clock signals, so as to suppress the chromatic aberration caused by the mismatch of the line impedance of the clock signals on the display panel.

In order to make the above-mentioned features and advantages of the disclosure more comprehensible, the following embodiments are given and described in detail with the accompanying drawings as follows.

BRIEF DESCRIPTION OF THE DRAWINGS

FIGURE is a schematic system diagram of a display apparatus according to an embodiment of the disclosure.

DESCRIPTION OF THE EMBODIMENTS

Unless otherwise defined, all terms (including technical and scientific terms) used herein have the same meaning as commonly understood by persons skilled in the art to which this disclosure belongs. It is to be understood that such terms, such as those defined in commonly used dictionaries, should be interpreted as having meanings consistent with the relevant art and the background or context of the disclosure, and should not be interpreted in an idealized or overly formal manner, unless specifically defined in the disclosure.

It is to be understood that, although the terms "first," "second," "third," etc. may be used herein to describe various elements, components, regions, layers, and/or sections, these elements, components, regions, and/or sections shall not be limited by these terms. These terms are only used to distinguish one element, component, region, layer, or section from another element, component, region, layer, or section. Therefore, "first element," "first component," "first region," "first layer," or "first section" mentioned below may be referred to as "second element," "second component," "second region," "second layer," or "second section" without departing from the teachings in the disclosure.

The terms used herein is merely for describing particular embodiments and is not limiting. As used in the disclosure, unless specifically defined, the singular forms "a," "an," and "the" are intended to include the plural forms including "at least one"; and the term "or" means "and/or". As used in the disclosure, the term "and/or" includes any and all combinations of one or more of the associated listed items. It is also to be understood that, when used in the disclosure, the terms "comprising" and/or "including" designate the presence of stated features, regions, integers, steps, operations, elements, and/or components, but do not exclude one or more of the presence, or addition, of other features, regions, integers, steps, operations, elements, components, and/or combinations thereof.

FIGURE is a system schematic diagram of a display apparatus according to the first embodiment of the disclosure. Referring to the FIGURE, in the embodiment, the display apparatus 100 includes a rigid printed circuit board 110, a plurality of flexible printed circuit boards 120_1~120_9, and a display panel 130. The rigid printed circuit board 110 is coupled (or electrically connected) to the display panel 130 via the flexible printed circuit boards 120_1~120_9. Numbers in the reference numerals are used to distinguish different elements, not to limit the number of the elements.

The display panel 130 has a fan-out area 131 and a display area 132. The first side 120_1a (e.g., a left side shown in FIGURE) of each flexible printed circuit board (the flexible printed circuit board 120_1 is taken as an example) is configured with a plurality of first traces TC1 (shown here as a single line, but in fact, each clock signal CK1~CK8 is transmitted by a different first trace TC1) for transmitting a first group of clock signals CK1~CK8 among a plurality of clock signals CK1~CK16, and a second side 120_1b (e.g., a right side shown in FIGURE) of each flexible printed circuit board (the flexible printed circuit board 120_1 is also taken as an example) opposite to the first side 120_1a is configured with a plurality of second traces TC2 (shown here as a single line, but in fact, each clock signal CK9~CK16 is transmitted by a different second trace TC2) for transmitting a second group of clock signals CK9~CK16 among the plurality of clock signals CK1~CK16. The number of clock signals is given as an example for illustration, but the embodiment of the disclosure is not limited thereto.

The first group of clock signals CK1~CK8 of one of the flexible printed circuit boards (e.g., the flexible printed circuit boards 120_1~120_9) and the second group of clock signals CK9~CK16 of an adjacent flexible printed circuit board (e.g., the flexible printed circuit boards 120_1~120_9) are transmitted to the display area 132 through the fan-out area 131 together. For example, the first group of clock signals CK1~CK8 of the flexible printed circuit board 120_2 and the second group of clock signals CK9~CK16 of the adjacent flexible printed circuit board 120_1 are transmitted to the display area 132 through the fan-out area 131 together; the first group of clock signals CK1~CK8 of the flexible printed circuit board 120_3 and the second group of clock signals CK9~CK16 of the adjacent flexible printed circuit board (not shown) are transmitted to the display area 132 through the fan-out area 131 together; and the rest are shown in FIGURE and will not be repeated here.

Based on the above, the first group of clock signals CK1~CK8 has a long interval with the second group of clock signals CK9~CK16 on the same flexible printed circuit board (e.g., the flexible printed circuit board 120_1~120_9), but the first group of clock signals CK1~CK8 of each flexible printed circuit board (e.g., the flexible printed circuit boards 120_1~120_9) has a short interval with the second group of clock signals CK9~CK16 of the adjacent flexible printed circuit board (e.g., the flexible printed circuit boards 120_1~120_9). Therefore, the first group of clock signals CK1~CK8 of one of the flexible printed circuit boards (e.g., the flexible printed circuit boards 120_1~120_9) and the second group of clock signals CK9~CK16 of the adjacent flexible printed circuit board (e.g., the flexible printed circuit board 120_1~120_9) are transmitted to the display area 132 through the fan-out area 131 together to match a line impedance between the clock signals CK1~CK16, so as to suppress a chromatic aberration formed on the display panel 130 due to a mismatch of the line impedance of the clock signals CK1~CK16.

In the embodiment, the display area 132 is divided into a plurality of sub-display areas 132_1~132_3, and each sub-display area 132 at least receives the first group of clock signals CK1~CK8 of one of the flexible printed circuit boards 120_1~120_9 and the second group of clock signals CK9~CK16 of the adjacent flexible printed circuit board 120_1~120_9. For example, the sub-display area 132_1 can receive the first group of clock signals CK1~CK8 of the flexible printed circuit board 120_2 and the second group of clock signals CK9~CK16 of the flexible printed circuit board 120_1 and/or the first group of clock signals CK1~CK8 of the flexible printed circuit board 120_3 and the second group of clock signals CK9~CK16 of the flexible printed circuit board (not shown), and the rest are shown in FIGURE and will not be repeated here.

In the embodiment, each of the sub-display areas 132_1~132_3 is configured with at least one scan driver GDR (two scan drivers GDR are taken as an example here), and each scan driver GDR is configured to receive the first group of clock signals CK1~CK8 of one of the flexible printed circuit boards 120_1~120_9 and the second group of clock signals CK9~CK16 of the adjacent flexible printed circuit board 120_1~120_9. For example, the scan driver GDR on a left side 132_1a of the sub-display area 132_1 shown in FIGURE can receive the first group of clock signals CK1~CK8 from the flexible printed circuit board 120_2 and the second group of clock signals CK9~CK16 from the flexible printed circuit board 120_1, and the scan driver GDR on a right side 132_1b of the sub-display area 132_1 shown in FIGURE can receive the first group of clock signals CK1~CK8 from the flexible printed circuit board 120_3 and the second group of clock signals CK9~CK16 from the flexible printed circuit board (not shown), and the rest are shown in FIGURE and will not be repeated here.

In the embodiment, each flexible printed circuit board 120_1~120_9 is further configured with a data driver SiC and provides a plurality of display voltages Vdt to a corresponding sub-display areas (e.g., the sub-display areas 132_1~132_3) in the display area 132 based on the clock signals CK1~CK16.

In the embodiment, the rigid printed circuit board 110 is configured with a timing controller 111 and a clock generation circuit 112. The clock generation circuit 112 is configured to generate the clock signals CK1~CK16, and the timing controller 111 is configured to generate control signals (not shown) required for the operation of the scan driver GDR, control signals (not shown) required for the operation of the data driver SiC, and data displayed (not shown). The control signals (not shown) required for the operation of the scan driver GDR can be transmitted from the rigid printed circuit board 110 to each of the sub-display areas 132_1~132_3 through the flexible printed circuit boards 120_1~120_9.

In the embodiment, since the scan driver GDR is configured close to a side of the sub-display area (e.g., the sub-display areas 132_1~132_3), considering a lowest line impedance, one of the flexible printed circuit boards (e.g., the flexible printed circuit boards 120_1~120_9) which provides the first group of clock signals CK1~CK8 and the adjacent flexible printed circuit board (e.g., the flexible printed circuit board 120_1~120_9) which provides the second group of clock signals CK9~CK16 is immediately adjacent to the side of a corresponding sub-display area (e.g., the sub-display areas 132_1~132_3). For example, the flexible printed circuit board 120_1 which provides the second group of clock signals CK9~CK16 to the scan driver GDR on a left side 132_1a of the sub-display area 132_1 shown in FIGURE may be immediately adjacent to the left side 132_1a of the sub-display area 132_1, and the flexible printed circuit board 120_3 which provides the first group of clock signals CK1~CK8 to the scan driver GDR on a right side 132_1b of the sub-display area 132_1 shown in FIGURE may be immediately adjacent to the right side 132_1b of the sub-display area 132_1, and the rest are shown in FIGURE and will not be repeated here.

Relatively speaking, upon considering the overall line impedance, the first group of clock signals CK1~CK8 transmitted by one of the flexible printed circuit boards (e.g., the flexible printed circuit boards 120_1~120_9) and the second group of clock signals CK9~CK16 transmitted by the adjacent flexible printed circuit board (e.g., the flexible printed circuit board 120_1~120_9) may be adopted, but the embodiment of the disclosure is not limited thereto.

In the embodiment, regarding the flexible printed circuit board (e.g., the flexible printed circuit board 120_1~120_9)

which provides the second group of clock signals CK9~CK16 to the sub-display area (e.g., the sub-display area 132_1~132_3), the first group of clock signals CK1~CK8 of a first side is not transmitted to the display panel 130. In addition, regarding the flexible printed circuit board (e.g., the flexible printed circuit board 120_1~120_9) which provides the first group of clock signals CK1~CK8 to the sub-display area (e.g., the sub-display area 132_1~132_3), the second group of clock signals CK9~CK16 of a second side is not transmitted to the display panel 130. For example, the first group of clock signals CK1~CK8 of the first side 120_1a (i.e., a left side in FIGURE) of the flexible printed circuit board 120_1 is not transmitted to the display panel 130, and the second group of clock signals CK9~CK16 of the second side 120_1b (i.e., a right side in FIGURE) of the flexible printed circuit board 120_2 is not transmitted to the display panel 130, and the rest are shown in FIGURE and will not be repeated here.

In the embodiment, each sub-display area (e.g., the sub-display area 132_1~132_3) may correspond to a plurality of flexible printed circuit boards (e.g., the flexible printed circuit boards 120_1~120_9), and each sub-display area (e.g., the sub-display area 132_1~132_3) may only need a limited group (e.g., 2 groups) of the clock signals CK1~CK16. Therefore, some of the first group of clock signals CK1~CK8 and the second group of clock signals CK9~CK16 transmitted by the flexible printed circuit boards (such as the flexible printed circuit boards 120_1~120_9) are not transmitted to the display panel 130.

In summary, in the display apparatus of the embodiment of the disclosure, the first group of clock signals has a long interval with the second group of clock signals on the same flexible printed circuit board, but the first group of clock signals of each flexible printed circuit board has a short interval with the second group of clock signals of the adjacent flexible printed circuit board. Therefore, the first group of clock signals of one of the flexible printed circuit boards and the second group of clock signals of the adjacent flexible printed circuit board are transmitted to the display area through the fan-out area together to match the line impedance between the clock signals, so as to suppress the chromatic aberration formed on the display panel due to the mismatch of the line impedance of the clock signals.

Although the disclosure has been disclosed with reference to the embodiments above, they are not intended to limit the disclosure. Anyone with ordinary knowledge in the technical field can make some changes and modifications without departing from the spirit and scope of the disclosure. Therefore, the protection scope of the disclosure shall be determined by the appended claims.

What is claimed is:

1. A display apparatus, comprising:
   a display panel comprising a fan-out area and a display area; and
   a plurality of flexible printed circuit boards coupled to the display panel, wherein a first side of each of the flexible printed circuit boards is configured with a plurality of first traces for transmitting a first group of clock signals among a plurality of clock signals, and a second side of each of the flexible printed circuit boards opposite to the first side is configured with a plurality of second traces for transmitting a second group of clock signals among the clock signals,
   wherein the first group of clock signals of one of the flexible printed circuit boards and the second group of clock signals of an adjacent flexible printed circuit board are transmitted to the display area through the fan-out area together.

2. The display apparatus as claimed in claim 1, wherein each of the flexible printed circuit boards is further configured with a data driver which provides a plurality of display voltages to the display area based on the clock signals.

3. The display apparatus as claimed in claim 1, further comprising:
   a rigid printed circuit board coupled to the flexible printed circuit boards and configured with a timing controller and a clock generation circuit, wherein the clock generation circuit is configured to generate the clock signals.

4. The display apparatus as claimed in claim 1, wherein the display area is divided into a plurality of sub-display areas, and each of the sub-display areas at least receives the first group of clock signals of one of the flexible printed circuit boards and the second group of clock signals of the adjacent flexible printed circuit board.

5. The display apparatus as claimed in claim 4, wherein each of the sub-display areas is configured with at least one scan driver, and each scan driver is configured to receive the first group of clock signals of one of the flexible printed circuit boards and the second group of clock signals of the adjacent flexible printed circuit board.

6. The display apparatus as claimed in claim 4, wherein one of the flexible printed circuit boards or the adjacent flexible printed circuit boards is immediately adjacent to a side of a corresponding sub-display area.

7. The display apparatus as claimed in claim 1, wherein the second group of clock signals on the second side of one of the flexible printed circuit boards is not transmitted to the display panel.

8. The display apparatus as claimed in claim 1, wherein the first group of clock signals on the first side of the adjacent flexible printed circuit board is not transmitted to the display panel.

* * * * *